United States Patent
Fischer

(10) Patent No.: US 6,693,860 B1
(45) Date of Patent: Feb. 17, 2004

(54) TIMING SIGNAL RECOVERY BY SUPERHETERODYNE PHASE LOCKED LOOP

(75) Inventor: Michael C. Fischer, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 544 days.

(21) Appl. No.: 09/692,309

(22) Filed: Oct. 20, 2000

(51) Int. Cl.[7] .................................................. G11B 7/00
(52) U.S. Cl. ................................ 369/44.26; 369/47.15; 369/47.28; 369/53.23; 369/53.34
(58) Field of Search ........................... 369/44.13, 44.41, 369/44.31, 44.19, 59.1, 59.2, 13.55, 44.26, 44.34, 44.35, 47.51, 53.26, 53.37, 59.12, 47.28, 53.23, 53.34

(56) References Cited

U.S. PATENT DOCUMENTS

| | | | |
|---|---|---|---|
| 4,642,573 A | | 2/1987 | Noda et al. |
| 5,663,941 A | * | 9/1997 | Aoshima ................. 369/44.34 |
| 5,737,694 A | | 4/1998 | McMahill et al. |
| 5,857,004 A | | 1/1999 | Abe |
| 6,262,955 B1 | * | 7/2001 | Kim ......................... 369/44.41 |
| 6,345,018 B1 | * | 2/2002 | Maegawa et al. ........ 369/44.13 |

OTHER PUBLICATIONS

Egan, W., "Modulation, sidebands, and noise spectrums", Frequency Synthesis by Phase Lock, PP 70–299, NY 1981.

* cited by examiner

Primary Examiner—William Korzuch
Assistant Examiner—Kim-Kwok Chu

(57) ABSTRACT

A circuit for recovering the timing reference signal includes a superheterodyne phase locked loop. The recovery circuit avoids the need for a phase linear filter with a large percentage bandwidth and allows placement of the filter at a point in the recovery circuit where the center frequency to be passed is substantially fixed. The recovery circuit thus constructed further allows the bandwidth of the filter to be narrower and tailored to match the modulation characteristics of the timing recovery signal. This further results in a better signal-to-noise ratio into a limiter and phase detector, improving the performance of the phase locked loop.

17 Claims, 2 Drawing Sheets

TIMING SIGNAL RECOVERY BY SUPERHETERODYNE PHASE LOCKED LOOP

TECHNICAL FIELD

The technical field is rewritable optical storage media, and in particular, rewritable digital video discs.

BACKGROUND

A timing signal recovery circuit is needed to record and read data on an optical storage device such as a digital video disc. The optical storage device may include a pilot tone, or reference signal. An example of such a reference signal is a wobble in the path of a groove on a disc for optical recording.

A raw wobble signal extracted from tracking or other optical detectors in the optical data storage device contains, in addition to the desired timing reference signal with its modulation, noise and interference from the main data recording and play back function and noise and interference from adjacent tracks. If the optical data storage device is operating in the desirable mode of constant angular velocity, then the center frequency range of the timing reference signal to be recovered is wide, greater than one octave, and typically 2.5 to 1. In order to isolate the timing reference signal with minimal jitter, and to demodulate the address or other information carried by this signal, filtering and synchronous detection with phase locked carrier regeneration can approach optimal performance. Satisfying these criteria places costly constraints on the phase linearity of at least one of the required filters.

SUMMARY

A circuit for recovering the timing reference signal includes a superheterodyne phase locked loop. The recovery circuit avoids the need for a phase linear filter with a large percentage bandwidth and allows placement of the filter at a point in the recovery circuit where the center frequency to be passed is substantially fixed. The recovery circuit thus constructed further allows the bandwidth of the filter to be narrower and tailored to match the modulation characteristics of the timing recovery signal. This further results in a better signal-to-noise ratio into a limiter and phase detector, improving the performance of the phase locked loop.

In an embodiment, the recovery circuit includes a high frequency reference oscillator that supplies a reference signal for use with the timing circuit. The reference signal is applied to a divide by M stage, where M relates to the number of data bits per wobble cycle. In this embodiment, the value of M is fixed. The thus-divided reference signal is further applied to a divide by 4 stage to produce an in-phase and a quadrature-phase signal for mixing in a superheterodyne mixer circuit. The output of a second mixer provides a timing signal 1/T.

In an alternative embodiment, a timing recovery circuit that provides more flexible tracking and control, and that uses a lower frequency local (reference) oscillator includes two loops, Loop A and Loop B. Loop A performs a superheterodyne tracking of a wobble signal, and outputs a regenerated wobble signal to Loop B. Loop B is a synthesizer loop that generates a main data clock frequency 1/T and a signal 4/T. Loop B also generates a recovered wobble frequency signal 1/MT, which may be used as a wobble timing output. The timing recovery circuit eliminates divider stages that may generate ambiguities and thus require synchronization.

A further advantage of the timing recovery circuit is that Loops A and B are in cascade but do not interact, allowing their characteristics to be independently adjusted. The overall transfer function of the timing recovery circuit will then be the cascade combination of Loops A and B. For example, Loop A may be set to have a narrow bandwidth to accomplish most of the needed filtering. Loop B can then be given a wide bandwidth for ease of acquiring lock. Alternatively, Loops A and B might be given similar bandwidths to use the cascade for optimal filtering. Because of the independent arrangement of the Loops A and B, the timing recovery circuit can operate with optical storage devices having different values of M.

DESCRIPTION OF THE DRAWINGS

The detailed description will refer to the following drawings in which.

DETAILED DESCRIPTION

A timing signal recovery circuit is used when recording and reading data on an optical storage device such as a digital video disc. The optical storage device includes a reference signal, such as a wobble, in the path of a groove on the optical storage device. The recovery circuit includes a superheterodyne phase locked loop. The recovery circuit avoids the need for a phase linear filter with a large percentage bandwidth and allows placement of the filter at a point in the recovery circuit where the center frequency to be passed is substantially fixed. The recovery circuit thus constructed further allows the bandwidth of the filter to be narrower and tailored to match the modulation characteristics of the timing recovery signal. This further results in a better signal-to-noise ratio into a limiter and phase detector, improving the performance of the phase locked loop.

In an embodiment, the optical storage device spins at a constant angular velocity. As a result, the data rate changes over the radius of the optical storage device. For a typical optical storage device, the data rate changes over a range of about 2.5 to 1 from the inner radius to the outer radius of the optical storage device. In order to recover a timing signal that is changing, where the bit rate is changing over a range of 2.5 to 1, a phase locked loop is used in the recovery circuit. The filtering and synchronization required by the recovery circuit are more efficient if the frequency range over which the filtering and synchronization must work can be limited to a narrow frequency range. To allow for a narrow frequency range, the recovery circuit includes a superheterodyne loop.

Figure 1:
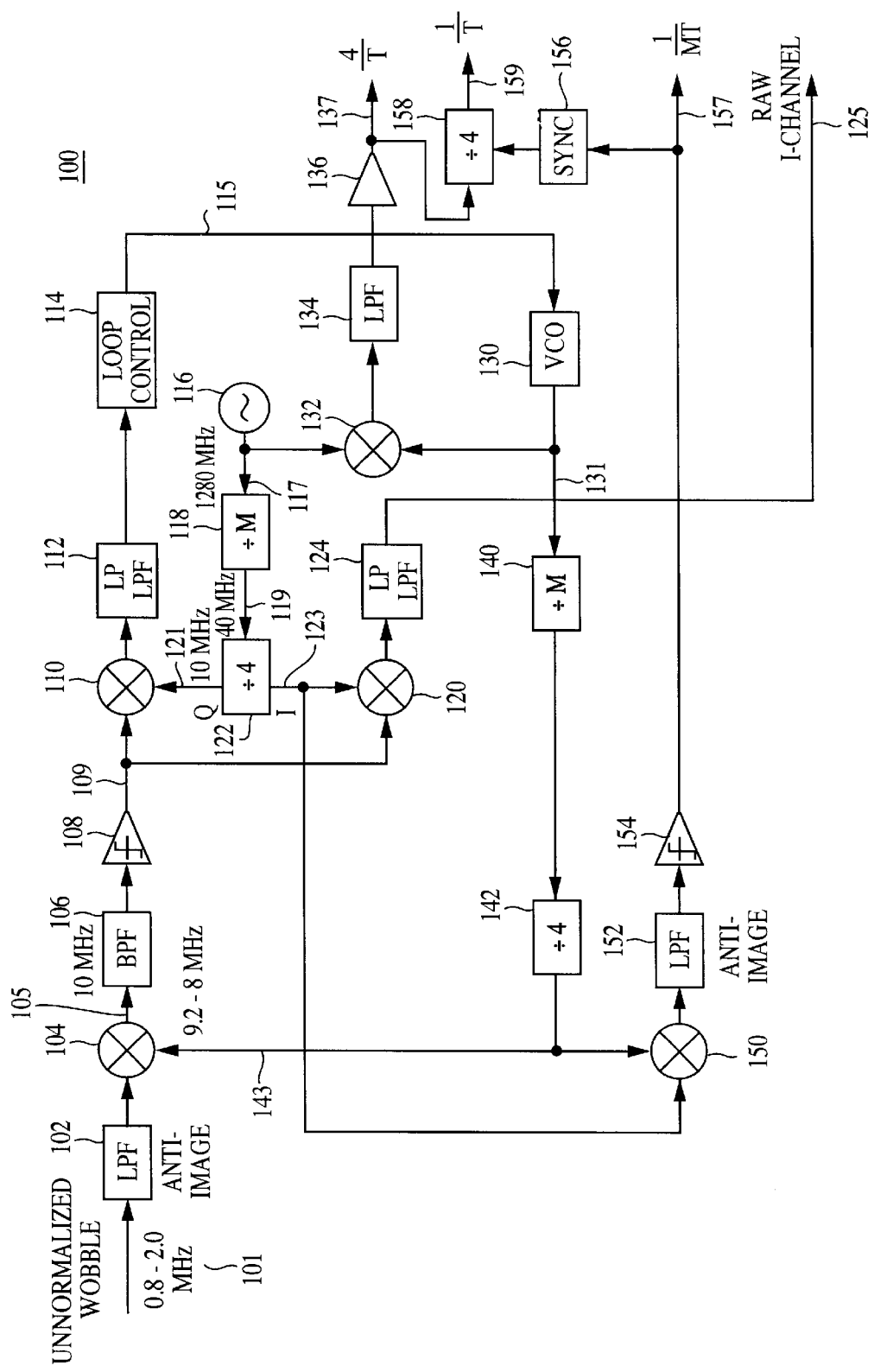
FIG. 1 is a diagram of an embodiment of a timing recovery circuit.

FIG. 1 illustrates a timing signal recovery circuit 100 that includes a superheterodyne phase locked loop. The recovery circuit 100 is used to recover a timing signal 1/T 159 from an analog input unnormalized tracking error signal, including wobble components, 101 (hereafter the wobble signal). The wobble signal 101 is shown for illustration purposes at 0.8 to 2.0 MHz (a change of 2.5 to 1). The frequency of the signal 101 represents a desired portion of an incoming signal, and the recovery circuit 100 is not limited to processing a signal restricted to the frequency band of 0.8 to 2.0 MHz.

The wobble signal 101 is applied to anti-image low pass filter (LPF) 102, which rejects frequencies that would otherwise mix with other components of the recovery circuit 100. The filtered wobble signal 101 is then applied to a mixer 104. The mixer 104 mixes in local signal 143, which for illustration purposes varies between 8.0 and 9.2 MHz. The mixer 104 generates a sum and difference signal to produce an up-shifted 10 MHz signal 105 that is essentially constant in frequency, with only noise and modulation components causing frequency variations. The 10 MHz signal 105 is then applied to a bandpass filter 106 centered around 10 MHz. Because the signal 105 is essentially constant, the bandpass filter 106 may operate over a very narrow frequency range to reject noise and to pass the desired signal information. The exact setting of the frequency range can be determined based on noise, tracking, and information considerations. The narrower the frequency range, the more noise is excluded. The wider the frequency range, the easier the recovery circuit 100 can track variations in disc speed. Finally, the frequency range must be wide enough to pass modulation information that accompanies the wobble signal 101 because the modulation includes disc addressing information.

The filtered signal 105 is applied to a hard limiter 108. The hard limiter 108 removes amplitude variations from the signal 105 and converts the signal 105 from an analog signal to a digital wobble signal 109. The digital wobble signal 109 is applied to XOR gates and associated logic circuitry 110 and 120. The XOR gates 110 and 120 perform a mixing function similar to that of an analog mixer. In particular, the XOR gate (mixer) 110 receives a 10 MHz quadrature-phase signal 121 and the XOR gate (mixer) 120 receives a 10 MHz in-phase signal 123. The 10 MHz signals 121 and 123 are "mixed" with the digital wobble signal 109 and the resulting output signals are applied to linear phase LPF 112 and 124, respectively. The in-phase signal 123 provides a reference at the mixer 120 to demodulate any modulation contained on the digital wobble signal 109. Thus, if the phase of the wobble signal 101 is reversed, as may be the case in binary phase shift keying, then such phase reversal can be sensed on the output of the mixer 120, and the polarity of the output of the mixer 120 will change.

The linear phase LPF filters 112 and 124 preserve the wave form of the wobble signal modulation. The output of the LPF 112 contains a tracking loop error signal and is applied to loop control circuit 114. The loop control circuit 114 controls tracking loop dynamics and bandwidth, and provides an output error signal 115 to a voltage controlled oscillator 130. At the voltage controlled oscillator 130, the output error signal 115 steers the frequency of an output signal 131 from the voltage controlled oscillator 130.

The output signal 131 is applied to a divide by M stage, and the frequency of the output signal 131 is divided by M, where M is a measure of the ratio between the length of a wobble cycle and the length of a data bit on a track, so that there are M data bits per wobble cycle. In an embodiment, the value of M is fixed for a particular optical recording device. The divided output signal is then applied to a divide by 4 stage 142, and the frequency of the output signal is further divided by 4 to produce the local signal 143. The local signal 143 is then applied to the mixer 104. This feed back ensures that the signal 105 applied to the bandpass filter 106 is close to the desired 10 MHz.

The quadrature-phase signal 121 and the in-phase signal 123 are generated starting with a local oscillator 116, which provides a 1280 MHz output signal 117. The signal 117 is applied to a divide by M stage 118 to produce a 40 MHz signal 119. The 40 MHz signal 119 is applied to a divide by 4 stage 122 to produce the quadrature-phase signal 121 and the in-phase signal 123.

The output signal 117 from the local oscillator 116 is also applied to a mixer 132. The mixer receives a second input as the output signal from the voltage controlled oscillator 130. The mixer 132 then provides an output signal to a low pass filter 134. The output signal of the LPF 134 is applied to a buffer/amplifier 136 to produce a 4/T signal 137. The 4/T signal 137 is further provided to a divide by 4 stage 158 to produce the desired timing signal 1/T 159.

Returning to the divide by 4 stage 122, the in-phase signal 123 is mixed with the digital wobble signal 109 in the mixer 120, and the resulting output signal is applied to the linear phase LPF 124 to produce a raw I-channel signal 125. The in-phase signal 123 is also applied to a mixer 150. A second input to the mixer 150 is the signal 143, between 8.0 and 9.2 MHz. The mixer 150 produces sum and difference signals. The output of the mixer 150 is termed a recovered wobble signal (analog). The recovered wobble signal is applied to an anti-image LPF 152 to select only the difference frequency output from the mixer 150. The output of the LPF 152 is then applied to a hard limiter 154 to produce digital recovered wobble signal 1/MT 157. The recovered wobble signal 1/MT 157 is also applied to a synchronization circuit 156. The synchronization circuit 156 controls synchronization of the divide by 4 circuit 158 in order to produce the timing signal 159. Synchronization control is necessary because in a power-up situation, the divide by 4 stage 158 can come up in one of four different states: zero-zero, zero-one, one-zero and zero-zero. Only one of the four states will have the proper phase relationship to the recovered wobble signal 1/MT 157. The synchronization circuit 156 takes the recovered wobble signal 1/MT 157 and forces the phase of the divide by 4 stage 158 to correspond to the phase of the recovered wobble signal 1/MT 157.

The recovery circuit 100 shown in FIG. 1 allows use of a narrow bandwidth phase linear bandpass filter 106. The bandwidth of the bandpass filter 106 need only cover the relatively narrow modulation bandwidth of the wobble signal. However, the recovery circuit 100 requires a high frequency local (reference) oscillator, has a limited maximum input frequency for the unnormalized wobble signal, and requires an optical storage device with a fixed value of M.

Figure 2:
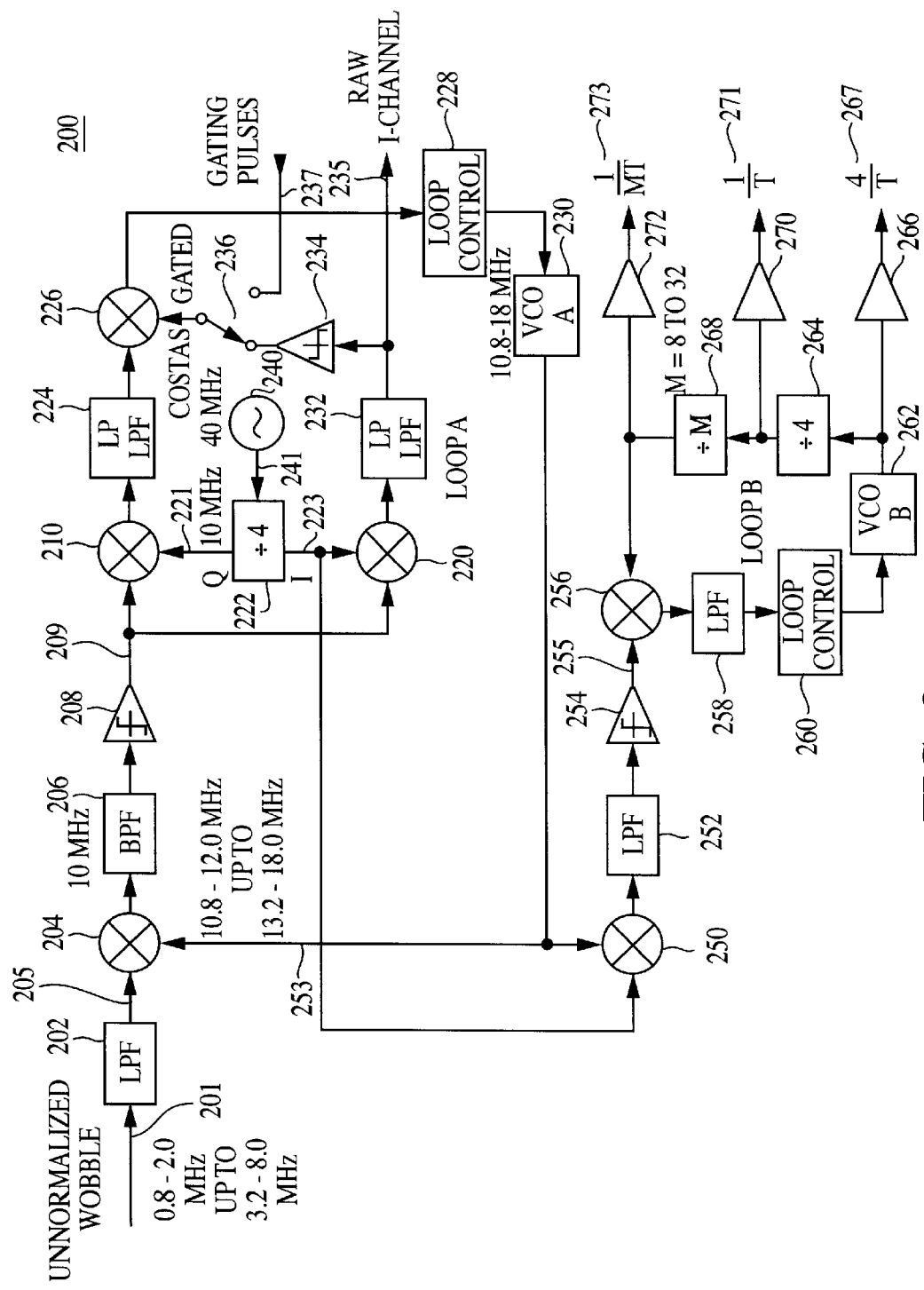
FIG. 2 is a diagram of another embodiment of a timing recovery circuit.

FIG. 2 illustrates a circuit 200 that provides more flexible tracking and control, and that uses a lower frequency local (reference) oscillator. The circuit 200 includes two loops, Loop A and Loop B. Loop A performs a superheterodyne tracking of wobble signal 201, and outputs a regenerated wobble signal 255 to Loop B. Loop B is a synthesizer loop that generates a main data clock frequency 1/T 271 and a signal 4/T 267. Loop B also generates a recovered wobble frequency signal 1/MT, which may be used as a wobble timing output. The circuit 200 eliminates divider stages that may generate ambiguities and thus require synchronization.

A further advantage of the circuit 200 is that Loops A and B are in cascade but do not interact, allowing their characteristics to be independently adjusted. The overall transfer function of the circuit 200 will then be the cascade combination of Loops A and B. For example, Loop A may be set to have a narrow bandwidth to accomplish most of the needed filtering. Loop B can then be given a wide bandwidth for ease of acquiring lock. Alternatively, Loops A and B might be given similar bandwidths to use the cascade for optimal filtering. Because of the independent arrangement of the Loops A and B, the circuit 200 can operate with optical storage devices having different values of M.

An unnormalized wobble signal 201 received at the circuit 200 may vary from 0.8 to 2.0 MHz up to 3.2 to 8.0

MHz (2.5 to 1). The unnormalized wobble signal 201 is applied to an anti-image LPF 202. The LPF functions in a manner similar to that of the LPF 102 shown in FIG. 1. The output of the LPF 202 is applied to a mixer 204. The mixer 204 also receives a signal 253 at 10.8 to 12.0 MHz up to 13.2 to 18.0 MHz. The mixer mixes the two signals to produce a shifted analog output signal 205 at 10 MHz. The 10 MHz signal 205 is applied to a bandpass filter 206 that has a bandwidth selected to pass the base signal and its modulation component. Thus, the bandpass filter 206 may be designed with a relatively narrow bandwidth, which makes realization of an effective filter much easier than the case of a broad bandwidth filter. The filtered output of the bandpass filter 206 is provided to a hard limiter 208 to provide a digital recovered wobble signal 209.

The wobble signal 209 is provided to quadrature-phase mixer 210 and in-phase mixer 220. As shown in FIG. 2, the mixers 210 and 220 may be implemented as XOR gates and associated logic circuitry. The mixers 210 and 220 may also be implemented as analog demodulators if the input signal from the bandpass filter 206 is provided in an analog format. The mixers 210 and 220 mix reference signals provided by a local (reference) oscillator 240. The local oscillator provides a 40 MHz signal 241 to a divide by 4 stage 222. The divide by 4 stage 222 provides a quadrature-phase signal 221 at 10 MHz and an in-phase signal 223 at 10 MHz.

The output of the mixer 210 is provided to a linear phase LPF 224. The output of the mixer 210 includes the information needed to control voltage controlled oscillator 230, and to steer the voltage controlled oscillator 230 and for tracking purposes. The output of the linear phase LPF 224 is provided to a costas demodulator 226. The output of the mixer 220 is provided to a linear phase LPF 232, and the output of the linear phase LPF 232 is provided to a hard limiter 234 to provide a digital input control signal to the costas demodulator 226. This input to the costas demodulator 226 is provided through switch 236. The switch 236 may also be selected to provide gatting pulse signal 237 to the costas demodulator 226.

Loop A may be switched into a costas demodulator mode, which would be necessary if binary phase shift keying were used as the modulation means on the wobble signal 201. To keep the Loop A tracking through binary phase shift keying-type modulation, a digitized raw I-channel information signal is fed into the costas demodulator 226. The costas demodulator 226 operates as a phase inverter, and inverts the phase of the error signal out of the quadrature-phase mixer 210 before the error signal is fed to loop control 228 and voltage controlled oscillator 230. The inversion of the wobble signal accounts for the fact that the phase of the wobble signal was inverted when the binary phase shift keying is applied. After the inversion, the wobble signal is applied to the loop control 228, where it is used to steer the voltage controlled oscillator 230. The voltage controlled oscillator 230 in turn provides the local oscillator signal to the mixer 204.

The output of Loop A is provided in cascade to synthesizer Loop B. In particular, the output of the voltage controlled oscillator 230 and the in-phase reference signal 223 are mixed in mixer 250. The difference between the two frequencies is taken by the LPF 252 as the recovered wobble signal. The recovered wobble signal contains none of the amplitude variations that might have been on the input wobble signal but the recovered wobble signal has exactly the same frequency characteristics as tracked by the costas demodulator 226 and passed through LPF 252. The output of the LPF 252 is provided to a hard limiter 254 to produce digital signal 255. The synthesizer Loop B provides 1/MT signal 273, timing signal 1/T 271 and 4/T signal 267. A feedback loop including LPF 258, loop control 260, voltage controlled oscillator B 262 and divide by M and divide by 4 stages 268 and 264, respectively, provide control and steering of Loop B. In particular, Loop B tracks the wobble signal 201 at a frequency 1/MT so that any phase error that exists at the mixer 256 goes to the LPF 258 into the loop control 260 for Loop B. The voltage controlled oscillator B 262 is steered so that the frequency out of the voltage controlled oscillator B 262, once divided by 4 and divided by M, matches the frequency of the in-phase input signal 255.

What is claimed is:

1. A timing recovery circuit for use with a rewritable optical storage device, comprising:

a first mixer that receives an unnormalized tracking signal containing wobble components;

a bandpass filter coupled to the first mixer, the bandpass filter having a bandwidth including a modulation component of the wobble components;

a second mixer circuit coupled to the bandpass filter, the second mixer circuit providing a reference input to the first mixer;

a fixed reference frequency circuit that provides a fixed frequency input to the second mixer circuit; and a synchronization circuit coupled to a divide stage of the second mixer circuit, wherein the synchronization circuit controls a state of the divide stage, and wherein the divide stage of the second mixer circuit produces a timing recovery signal.

2. The timing recovery circuit of claim 1, wherein the second mixer circuit comprises:

a quadrature-phase mixer;

a voltage controlled oscillator coupled to an output of the quadrature-phase mixer; and an in-phase mixer, wherein the quadrature-phase mixer and the in-phase mixer receive the fixed frequency reference input, and wherein the quadrature-phase mixer steers the voltage controlled oscillator to provide the reference input to the first mixer.

3. The timing recovery circuit of claim 2, wherein the second mixer circuit further comprises:

a linear phase low pass filter coupled to the quadrature-phase mixer; and a loop control coupled to the linear phase low pass filter and the voltage controlled oscillator.

4. The timing recovery circuit of claim 2, wherein the second mixer circuit further comprises:

a linear phase low pass filter coupled to the quadrature-phase mixer;

a costas demodulator coupled to the linear phase low pass filter, wherein the costas demodulator receives an output from the in-phase mixer; and a loop control coupled to the costas demodulator and the voltage controlled oscillator.

5. The timing recovery circuit of claim 2, wherein the quadrature-phase and in-phase mixers are exclusive OR (XOR) gates.

6. The timing recovery circuit of claim 2, further comprising:

a second mixer coupled to the voltage controlled oscillator and the fixed frequency circuit, the second mixer providing an intermediate timing recovery signal; and wherein the divide stage is a divide by 4 stage.

7. The timing recovery circuit of claim 2, further comprising a synthesizer loop coupled to the voltage controlled oscillator and the fixed frequency circuit, wherein the synthesizer loop provides a timing signal 1/T.

8. The timing recovery circuit of claim 1, wherein the fixed frequency circuit comprises a local divide by 4 stage.

9. The timing recovery circuit of claim 8, wherein the fixed frequency circuit further comprises a divide by M stage.

10. The timing recovery circuit of claim 8, wherein an in-phase output of the local divide by 4 stage is provided to the in-phase mixer and wherein a quadrature phase output of the local divide by 4 stage is provided to the quadrature-phase mixer.

11. A timing recovery circuit, comprising:
- a first mixer that receives a tracking error signal including wobble components and provides a recovered wobble signal including a modulation component;
- a superheterodyne phase locked loop that controls a voltage controlled oscillator to produce an input to the first mixer;
- a bandpass filter that receives an output from the first mixer, wherein a bandwidth of the bandpass filter includes a frequency range of the recovered wobble signal and the modulation component; and
- a timing signal circuit that produces a timing signal 1/T.

12. The timing recovery circuit of claim 11, further comprising:
- a loop control circuit coupled to the voltage controlled oscillator; and
- a linear phase low pass filter coupled to the loop control circuit.

13. The timing recovery circuit of claim 12, further comprising a costas demodulator coupled between the linear phase low pass filter and the loop control circuit, wherein the costas demodulator inverts the tracking error signal.

14. A method of recovering a timing signal from a rewritable optical storage device, comprising:
- receiving an unnormalized error tracking signal, the unnormalized error tracking signal including wobble components;
- at a first mixer, mixing the unnormalized error tracking signal with a reference signal to produce a stable frequency signal;
- passing the stable frequency signal through the bandpass filter to produce a filtered signal;
- supplying the filtered signal to a second mixer circuit;
- a second mixer circuit providing a reference input to the first mixer.
- generating a timing recovery signal from a divide stage of the second mixer circuit.

15. The method of claim 14, further comprising:
in the second mixer circuit:
generating a quadrature-phase signal in a quadrature-phase mixer,
generating an in-phase signal in an in-phase mixer, and
generating a fixed frequency reference signal.

16. The method of claim 15, further comprising:
steering a voltage controlled oscillator using an output of the quadrature-phase mixer; and
using an output of the voltage controlled oscillator to generate the reference input to the first mixer.

17. The method of claim 15, wherein the quadrature phase and the in-phase mixers are Exclusive-OR gates.

\* \* \* \* \*